United States Patent [19]

Solomon et al.

[11] Patent Number: 4,616,242
[45] Date of Patent: Oct. 7, 1986

[54] ENHANCEMENT AND DEPLETION MODE SELECTION LAYER FOR FIELD EFFECT TRANSISTOR

[75] Inventors: Paul M. Solomon; Steven L. Wright, both of Yorktown Heights, N.Y.

[73] Assignee: International Business Machines Corporation, Armonk, N.Y.

[21] Appl. No.: 731,822

[22] Filed: May 8, 1985

[51] Int. Cl.$^4$ .................. H01L 29/64; H01L 29/80
[52] U.S. Cl. ........................................ 357/22; 357/15
[58] Field of Search ............................. 357/15, 22, 42

[56] References Cited

U.S. PATENT DOCUMENTS

| | | | |
|---|---|---|---|
| 3,767,984 | 10/1973 | Shinoda et al. | 357/22 |
| 4,038,563 | 7/1977 | Zuleeg et al. | 357/22 |
| 4,424,525 | 1/1984 | Mimura | 357/22 |

FOREIGN PATENT DOCUMENTS 54-10684  1/1979  Japan ..................... 357/22

Primary Examiner—Gene M. Munson
Attorney, Agent, or Firm—Perman & Green

[57] ABSTRACT

A field effect transistor structure suitable for use in an array of such structures disposed on a common substrate (14) is formed with a source terminal (22), a drain (24) terminal, and a gate terminal (26) upon an upper surface of a semiconductor chip. The chip includes a first layer (18) and a second layer (20), the first layer being grown epitaxially upon the second layer. The first layer forms a part of the gate terminal and the second layer includes a charge conduction channel coupling the source region and the drain region. A pocket layer (16) is disposed in the second layer beneath the terminals of the transistor structure and is doped with either an donor dopant or an acceptor dopant for altering the electric field at the conduction channel to insert electrons or remove electrons therefrom so as to convert an operating mode from either an enhancement mode to a depletion mode or from a depletion mode to an enchancement mode. A substrate with a terminal on the backside thereof may be placed contiguous the bottom of said second layer, the back terminal being applied to a negative source of voltage for a transistor structure of n-channel format. The semiconductor material of the chip is a obtained from compounds of elements of the groups III and V of the periodic table.

38 Claims, 3 Drawing Figures

MODFET BAND DIAGRAMS

ENHANCEMENT AND DEPLETION MODE SELECTION LAYER FOR FIELD EFFECT TRANSISTOR

DESCRIPTION

1. Technical Field

This invention relates to semiconductor devices, such as field-effect transistors (FET's) which have a control layer buried in the semiconductor material beneath the channel for changing the mode of operation between enhancement and depletion modes.

2. Prior Art

Integrated circuits are constructed with a large number of semiconductor devices including field-effect transistors for performing various functions such as logic, memory, and signal-conditioning functions. In the construction of electronic circuits which perform the foregoing functions, it is often advantageous to employ both depletion-mode FET's and enhancement mode FET's.

In an n-channel depletion-mode FET, current flows in the presence of zero volts impressed between the gate and the source terminals, the current being terminated upon application of a negative voltage to the gate terminal relative to the source terminal. In n-channel enhacement-mode FET's, there is no current flow in the presence of zero volts between the source and the gate terminals, the current being initiated by the application of a positive voltage to the gate terminal relative to the source terminal. The foregoing two gate voltage relationships permit the combination of enhancement-mode and depletion-mode FET's and a complementary circuit configuration.

A problem arises in the construction of large arrays of FET's when it may be desired to construct both a depletion-mode FET and an enhancement-mode FET on a single substrate as part of an integrated circuit (IC). Both forms of FET's can be built with the same physical structure, the differing characteristics of the two types of FET's being attained by differences in the doping of a semiconductor materials employed in the construction. While FET's may be constructed of silicon, the transistors of particular interest herein are constructed of a semiconductor compound of elements taken from group III and group V of the periodic table because the III-V compounds provide FET's with substantially higher frequency characteristics than are provided by silicon transistors.

The problem is manifested by the different doping requirements of individual ones of the FET's in the array of FET's to provide for the desired depletion and enhancement characteristics. The desired characteristics can also be obtained by altering the physical structure of the gate region or the thickness of a top layer of semiconductor material. In both cases, the attainment of the desired characteristics is accomplished by fabrication processes operating from the top surface inward to provide the requisite structure and/or doping. However, as a practical matter in the construction or large arrays of FET's, it is much simpler to construct all of the transistors with the same physical structures and with the same doping, such being the case whether the transistors are of the metal-oxide semiconductor formed with an insulated gate, or a metal semiconductor construction with a Schottky barrier or an FET including modulation doping (MODFET), or a semiconductor-insulator-semiconductor FET.

SUMMARY OF THE INVENTION

The foregoing problem is oversome and other advantages are provided by the construction of semiconductor devices such as FET's with an additional structural component which, in accordance with the invention, is formed as a doped semiconductor layer located in a pocket beneath a transistor for altering the threshold voltage. The pocket layer is underneath and separated from the charge conduction channel between source and drain regions of the transistor. The separation of the pocket and the channel is particularly important in devices such as the MODFET, where preservation of a large carrier mobility in the channel is highly desirable. Furthermore, the method of altering the threshold voltage is well suited to insulated-gate structures, such as the gallium-arsenide gate FET.

In the construction of a preferred embodiment of the device of the invention, the device contains all of the physical features of a field-effect transistor, and further comprises the foregoing pocket layer disposed beneath and spaced apart from the source and drain regions of the transistor. A preferred embodiment employs an n-channel MODFET in which a first, or top, layer is composed of group III-V compounds such as a layer of gallium-aluminum arsenide. A second layer, this layer underlying the first layer, is composed of a compound from the same group of elements such as gallium arsenide. The pocket layer is formed within the second layer by doping the gallium arsenide, and on a substrate of p-type conductivity of the same semiconductor as the second layer.

The doping of the pocket layer depends on the role which is played by the layer. For example, in the case wherein the pocket layer is to change an enhancement-mode FET to become a depletion-mode FET, the pocket layer is doped with a donor dopant such as silicon. Such doping provides electrons, which under the conditions of voltages applied to terminals of the device including a terminal on the back side of the device, migrate towards the charge conduction channel of the FET while depleting the pocket layer. By filling the conductor channel with electrons, the pocket layer alters the characteristic of the FET from the enhancement mode (in which the conduction channel is substantially void of electrons) to the depletion mode (wherein the conduction band is substantially full of electrons). With the foregoing arrangement, all of the transistors in an array of transistors on an IC can be constructed identically as enhancement-mode FET's with specific ones of the transistors being singled out to be converted to depletion-mode FET's by installation of the pocket layer.

In the construction of the composite transistor structure of the invention, in which both the pocket layer and the FET are constructed together, the pocket layer is built before the construction of the top layer and the terminals. Typically, the construction would begin by providing a substrate which would serve as a bottom support for the transistor, and the foregoing second layer would be grown upon the substrate. Use of a p-type material in the substrate provides a well-defined electric field which improves carrier confinement in the conduction channel. The process would be altered for construction of the pocket as by epitaxial deposition of the pocket layer, after which construction of the second layer would be resumed by further epitaxial growth upon the underlying material of the second layer. Alternatively, the second layer can be completed in its entirety after which the doping of the pocket region can be accomplished by ion implantation. Thereafter, the first, or top, layer is grown epitaxially upon the second layer, and the source and drain regions are provided as by ion implantation or diffusion of a suitable dopant such as silicon for n-type substrates or beryllium for p-type substrates. The gate metal is then deposited upon the first layer to form the gate electrode and thereby complete the gate terminal. The source and drain terminals are formed, typically, of metal alloy and thus serve as ohmic contacts of the source and drain regions to the transistor.

BRIEF DESCRIPTION OF THE DRAWINGS

The aforementioned aspects and other features of the invention are explained in the following description taken in connection with the accompanying drawings wherein.

DETAILED DESCRIPTION OF THE PREFERRED EMBODIMENT OF THE INVENTION

Figure 1:
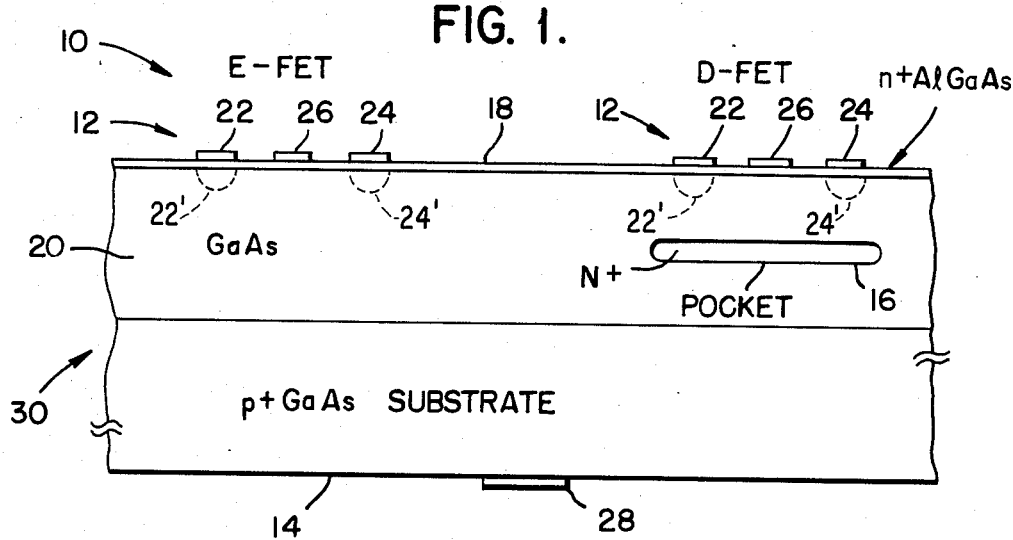
FIG. 1 is a simplified vertical sectional view, partially diagrammatic, of a portion of an array of field-effect transistors disposed on a common substrate wherein, in accordance with the invention, one of the transistors is provided with a pocket layer for conversion of the transistor characteristics from enhancement-mode to depletion-mode.
Figure 2:
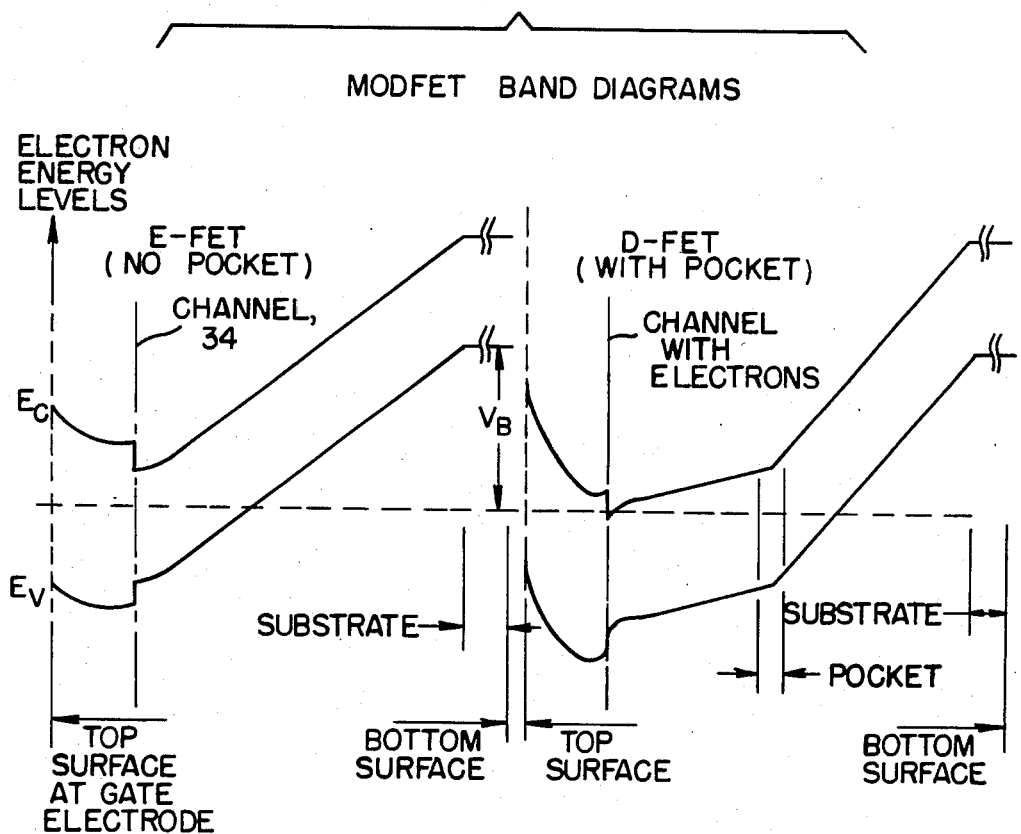
FIG. 2 shows two energy-band diagrams for a MODFET wherein the diagram on the left hand side corresponds to the enhancement-mode FET shown above the diagram in FIG. 1, and the diagram on the right hand side of FIG. 2 shows the corresponding energy band diagram for the depletion-mode FET above the diagram in FIG. 1.

With reference to FIGS. 1 and 2, there is shown an array 10 of field-effect transistors 12 disposed on a common substrate 14. Each transistor 12 is constructed with the same physical features and the same doping, and may be either of the enhancement-mode or of the depletion-mode. By way of example, FIG. 1 shows the transistors 12 constructed with the characteristic of the enhancement-mode with certain ones of the transistors 12, such as the transistor on the right side of the figure, having its characteristics altered to a depletion mode, in accordance with the invention, by implacement of a pocket layer 16 beneath a transistor 12.

Each of the transistors 12 comprises an upper layer 18 and a lower layer 20 both of which comprise semiconductor compounds of elements of groups III and V of the periodic table. The upper layer 18 is grown epitaxially upon the lower layer 20. The pocket layer 16 is located within the lower layer 20. Each of the transistors 12, further comprises a source terminal 22, a drain terminal 24 and a gate electrode 26 which are shown disposed upon the upper layer 18. A source region 22' and a drain region 24' underlie respectively the source terminal 22 and the drain terminal 24. While various semiconductor materials may be employed in the construction of the array 10, the exemplary embodiment of FIG. 1 employs n+AlGaAs in the upper layer 18, intrinsic GaAs in the lower layer 20 and p+GaAs in the substrate 14.

With respect to the construction of the pocket layer 16, the layer 16 is doped with a suitable dopant which is either a donor or an acceptor depending on the desired conversion of the transistor characteristic. Thus, by way of example, in the event that all of the transistors 12 were constructed and doped for depletion-mode operation, and it is desired to convert some of the transistors to operate in the enhancement mode, then the pocket layer 16 is doped with an acceptor dopant which receives electrons from the charge conduction band so as to convert the conduction band to that of an enhancement-mode transistor.

Alternatively, and as has been described above with respect to FIG. 1, the transistors 12 may be constructed to identical physical structure and doping for enhancement-mode operation, in which case the pocket layer 16 is doped with a donor dopant which provides electrons for the conduction channel to provide the characteristics of a depletion-mode channel. In the embodiment of FIG. 1, silicon is employed as the dopant for the pocket layer 16. The pocket layer 16 is spaced apart from the source region, drain region and gate terminals of its transistor 12. The pocket layer 16 is located beneath a charge conduction channel (to be described with reference to FIG. 3) at a depth which is greater than approximately three wavelengths of the electron wave function, but less than the spacing between the source and the drain terminals, to alter a threshold voltage while preserving a high carrier mobility in a transistor located above the pocket layer.

The lateral extent of the pocket layer 16 (in directions parallel to the interface between the lower layer 20 and substrate 14) is commensurate with the spacing between the transistor and the pocket layer. The pocket layer should extend laterally at least an amount equal to the extent of the gate region of the transistor and, preferably, extends still further under the source and the drain regions so as to adequately define the electric potential surface which alter the characteristics of the transistor. If the pocket layer is brought in more closely to its transistor, the lateral extent of the layer may be reduced, and if the pocket layer is located at a greater distance from its transistor, then the lateral extent of the layer should be enlarged so as to provide protection from fringing fields of other transistors 12 of the array 10. A typical spacing of the pocket from the transistor is approximately equal to the distance between the source and the drain terminals.

The operation of the pocket layer 16 in converting a transistor 12 from the enhancement mode to the depletion mode is explained in FIG. 2. Both of the graphs show electron energy levels for a MODFET as a function of depth into the semiconductor layers, the left side of each graph being the top surface of the upper layer 18 at the gate electrode, while the right hand side of each graph represents a back surface of the substrate 14. A terminal 28 is located on the back surface of the substrate 14 and, in operation of the device of FIG. 1, is connected to a negative voltage relative to a source terminal in each of the transistors 12, the source terminal being grounded, typically. The doping of the substrate 14 enables the substrate 14 to serve as a plane of uniform potential so that the energy band diagrams of FIG. 2 apply to each of the transistors 12 of the array 10. The structure of FIG. 1 may be regarded as a portion of an integrated-circuit chip 30.

The right hand side of each of the graphs of FIG. 2 are of constant energy levels corresponding to the electrically conducting characteristics of the substrate 14 on the back side of the chip 30. For convenience in portraying the energy diagrams, the right hand side of each of the graphs has been broken away to conserve space in the figure. Both graphs show a discontinuity in the conduction band and in the valence band at the site of a charge conduction channel shown in FIG. 3. The graph on the left represents the energy band format of the enhancement-mode FET's on the left side of FIG. 1, while the graph on the right side of FIG. 2 represents the band levels of the depletionmode FET on the right side of FIG. 1.

Both graphs show the lowest energy levels at a point beneath the gate terminal in each of the transistors. In the right hand graph, both the conduction band ($E_C$) and the valence band ($E_V$) drop to lower energy levels than the corresponding bands in the left graph. The change in band shape, including the discontinuity at the site of the pocket (right hand graph) are brought about by the effect of the pocket on electric potential surfaces within the chip 30 developed by voltages applied to the various terminals. In particular, it is noted that the pocket lies sufficiently close to the terminals of its transistor such that a significant part of the electric fields associated with each of the terminals intercept the pocket layer 16.

The feature of the invention wherein the characteristics of transistors are interchanged, namely that an enhancement mode is converted to a depletionmode or vice versa, is accomplished by the reduction of the potential of the conduction band. The reduction is a sufficient amount to allow the band to fill with electrons, this occurring in the chip 30 at the site of the conduction channel of the FET being modified by the pocket layer 16.

As a result, the depleted channel of an enhancement-mode FET becomes a full channel in a depletion-mode. The effect of the negative voltage applied to the back terminal 28 is identified in the left hand graph by $V_b$, wherein the back voltage is measured relative to the reference level (horizontal axis) in each of the graphs of FIG. 2. It is noted that in the operation of the pocket layer 16, the electrons thereof migrate to the conduction channel to a sufficient extent to leave the pocket layer 16 fully depleted.

Figure 3:
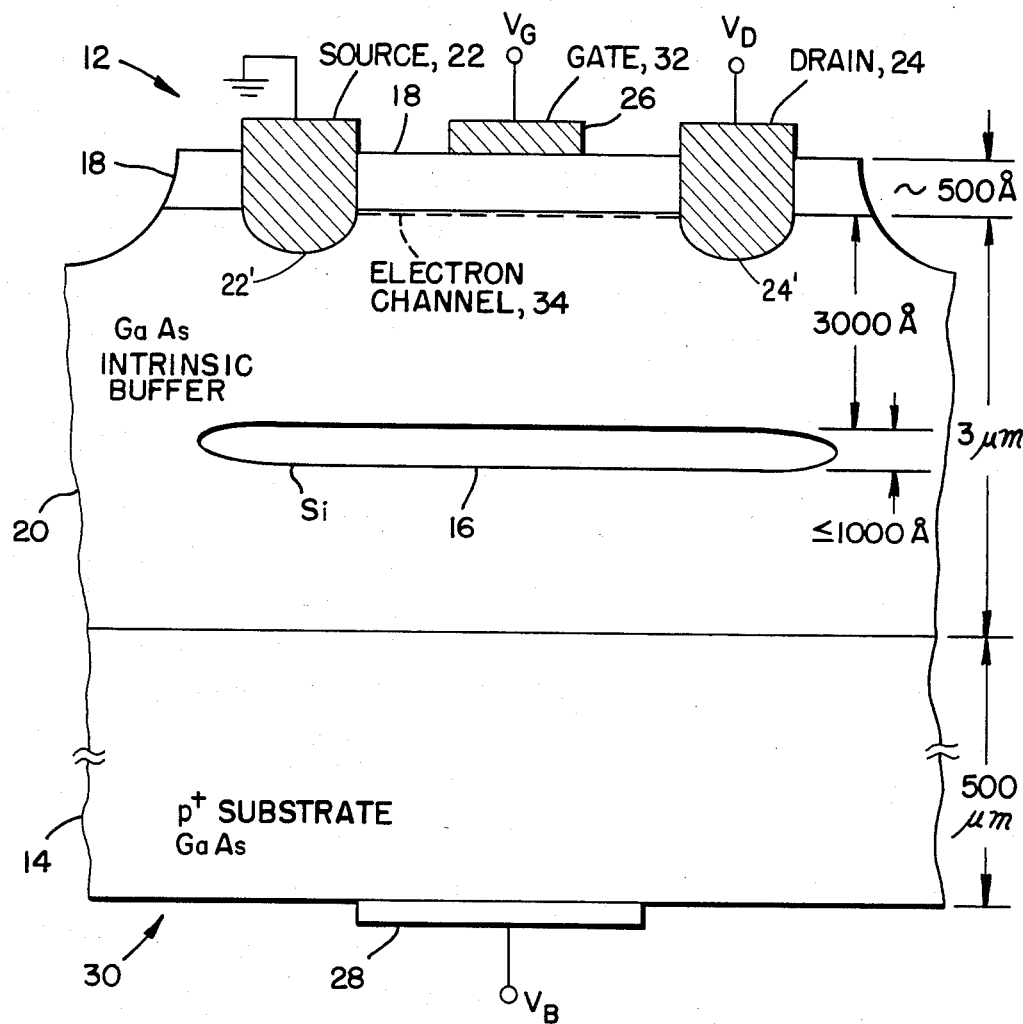
FIG. 3 shows a more detailed vertical sectional view of the depletion-mode FET of FIG. 1.

With reference also to FIG. 3, there is provided a further explanation of the construction of the right hand transistor 12 of FIG. 1. FIG. 3 shows only the portion of the chip 30 relating to the transistor 12 on the right side of FIG. 1. FIG. 3 shows the source and drain terminals 22 and 24 regions 22' and 24' of FIG. 1, as well as the gate electrode 26 and the back terminal 28. The gate electrode 26, in combination with the upper layer 18 contiguous thereto, form a gate terminal 32.

The upper layer 18 has a thickness of approximately 500 angstroms. The thickness of the pocket layer 16 is less than approximately 1000 angstroms, and is spaced apart from the upper layer 18 with a spacing of approximately 3000 angstroms. The lower layer 20 has a thickness of approximately 3 micrometers, and the substrate 14 has a thickness of approximately 500 micrometers. It is noted that the substrate 14 plays no specific role in the operation of the invention, other than providing a continuous electric potential surface along the backside of the chip.

A charge conduction channel 34 is disposed in the layer 20 alongside the interface between the layers 18 and 20, and conducts electrons between the source region 22' and the drain terminal 24'. Typically, the drain region 24' is operated at a voltage which is positive realtive to the source region 22 so as to attract the electrons from the source region 22. The gate voltage $V_G$ may be either positive or negative depending on whether the transistor operates in the enhancement-mode or in the depletion-mode. With respect to the transistor depicted in FIG. 3, this transistor operates in the depletion-mode and, accordingly, the gate voltage may be zero or negative. The substrate 14 may employ zinc as a suitable dopant for providing the p+ characteristic.

In the construction of FIG. 3, the gallium arsenide of the lower layer 20 serves as an intrinsic buffer layer. A silicon dopant in the pocket layer acts as a donor and is applied from a suitable source of ion implantation or diffusion with a dose of approximately $5 \times 10^{11}$ atoms per square centimeter. While the teachings of the figures apply to different forms of FET's, a MODFET has been disclosed as the preferred embodiment, and the band diagrams of FIG. 2 are drawn for the MODFET energy levels. Metal of the gate electrode 26 in contact with a semiconductor material of the upper layer 18 forms a Schottky barrier at the gate terminal 32.

The theory of the invention applies also to p-channel FET's, which FET's can be operated in either the depletion-mode or the enhancement-mode. With either the p-type or n-type FET's, the basic concept in the operation of the pocket layer is the same, namely, that the dopants in the pocket layer become depleted of either electrons or holes as may be required to impart the desired characteristics to the conduction channel 34.

Accordingly, in the construction of a p-channel FET, the physical arrangement of the components would be the same as that shown in the drawing figures for the n-channel device. However, the roles of the dopants in the pockets of the two devices would be reversed. Thus, in the p-channel FET, in acceptor dopants in the pocket converts the operating mode from enhancement mode to depletion mode, and a donor dopant in the pocket converts the operating mode from depletion mode to enhancement mode. The upper layer 18 is constructed of the same material in both the p-channel and the n-channel FET's, and the lower level 20 is constructed of the same material in both the p-channel and the n-channel FET's. In a preferred embodiment of the p-channel FET, silicon is advantageously utilized as the donor dopant, and beryllium is advantageously utilized as the acceptor dopant. The upper layer 18 comprises p+AlGaAs and the lower layer 20 comprises intrinsic GaAs.

By way of alternative embodiments of the n-channel FET, it is noted that the substrate may be composed of a semi-insulating substrate of gallium arsenide in which case the lower layer 20 would be p−GaAs. No terminal would be placed on the back side of the substrate due to the insulating properties of the substrate. The p−GaAs layer of the lower level 20 would provide an electrostatic coupling between the source terminal 22 and the pocket layer 16 and between the drain terminal 24 and the pocket layer 16. Thus, the dopant in the pocket layer 16 would have a strong effect on the energy level in the region of conduction channel 34, the effect being strong enough to practice the invention without the termianl on the back side of the substrate 14.

However, the pGaAs is preferred for the substrate 14 in view of the fact that the electrically conducting properites thereof establish well-defined electric field lines between the front and back surfaces of the chip 30. This greatly facilitates the selection of the spacing and size of the pocket layer 16 to provide the desired electrical characteristics for the transistor 12 of the array 10. The dimensions of size and placement shown in FIG. 3 provide good operation of the device. If desired, further adjustment of the dimensions of size and spacing may be applied to provide a desired set of current-voltage characteristics for the transistor 12.

It is to be understood that the above described embodiments of the invention are illustrative only and that modifications thereof may occur to those skilled in the art. Accordingly, this invention is not to be regarded as limited to the embodiments enclosed herein, but is to be limited only as defined by the appended claims.

Having thus described our invention, what we claim is new, and desire to secure by Letters Patent is:

1. A semiconductor system of field-effect transistors operative in either of two modes, namely, a depletion mode and an enhancement mode, the system comprising:
   a first layer of semiconductor material and a second layer of semiconductor material, said first layer being grown epitaxially on said second layer;
   a plurality of field-effect transistors;
   each of said tansistors sharing said first layer of semiconductor material and said second layer of semiconductor material;
   each of said transistors comprising a source region a drain region and a gate electrode; in each of said transistors said source and said drain region contacting said second layer to establish a charge conduction channel therein in response to the application of a voltage between said source and said drain region; in each of said transistors said gate electrode contacting said first layer between said source region and said drain region to form a gate terminal with said first layer; and
   means buried within said second layer beneath at least one of said transistors for changing the mode of operation of one of said operating modes to the other of said operating modes.

2. A system according to claim 1 wherein said mode changing means comprises a pocket layer of semiconductor material spaced apart from said source region and said drain region in a transistor located above said mode changing means.

3. A system according to claim 2 wherein said mode changing means extends laterally a distance at least as great as the extent of said gate terminal.

4. A system according to claim 3 wherein said mode changing means comprises a donor dopant for changing the enhancement mode to the depletion mode, said transistors being n-channel devices.

5. A system according to claim 3 wherein said mode changing means comprises an acceptor dopant for changing the enhancement mode to the depletion mode, said transistors being p-channel devices.

6. A system according to claim 3 wherein said mode changing means comprises an acceptor dopant for changing the depletion mode to the enhancement mode, said transistors being n-channel devices.

7. A system according to claim 3 wherein said mode changing means comprises a donor dopant for changing the depletion mode to the enhancement mode, said transistors being p-channel devices.

8. A system according to claim 3 wherein said mode changing means comprises a dopant specific to the mode of operation of a transistor above said mode changing means, there being either an acceptor dopant for changing an enhancement mode to a depletion mode or a donor dopant for changing a depletion mode to an enhancement mode, said transistors being p-channel devices.

9. A system according to claim 8 wherein said first layer and said second layer comprise semiconductor components of elements of Group III and Group V of the periodic table.

10. A system according to claim 3 wherein said mode changing means comprises a dopant specific to the mode of operation of a transistor above said mode changing means, there being either a donor dopant for changing an enhancement mode to a depletion mode or an acceptor dopant for changing a depletion mode to an enhancement mode, said transistors being n-channel devices.

11. A system according to claim 10 wherein said first layer and said second layer comprise semiconductor components of elements of Group III and Group V of the periodic table.

12. A system according to claim 11 wherein said first layer comprises n+AlGaAs and said second layer comprises intrinsic GaAs, each of said transistors being formed as an enhancement mode device in the absence of said pocket layer, said pocket layer being doped with silicon to provide a pocket of n+GaAs.

13. A system according to claim 12 further comprising a substrate of pGaAs disposed beneath said second layer.

14. A system according to claim 13 further comprising an electrode disposed on the back side of said substrate away from said second layer for receiving a voltage which is negative relative to said source terminal.

15. A system according to claim 14 wherein said pocket layer is under said source and said drain regions.

16. A system according to claim 15 wherein said gate electrode is formed of metal contiguous to said first layer to provide a Schottky barrier at said gate terminal.

17. A system according to claim 2 wherein said pocket layer is located beneath the charge conduction channel at a depth which is greater than approximately three wavelengths of the electron wave function, but less than the spacing between said source and said drain regions, to alter a threshold voltage while preserving a high carrier mobility in a transistor located above said pocket layer.

18. A system according to claim 17 wherein said mode changing means comprises a dopant specific to the mode of operation of a transistor above said mode changing means, there being either an acceptor dopant for changing an enhancement mode to a depletion mode or a donor dopant for changing a depletion mode to an enhancement mode, said transistors being p-channel devices.

19. A system according to claim 17 wherein said pocket layer includes a dopant specific to the mode of operation of a transistor above said mode changing means, there being either a donor dopant for changing an enhancement mode to a depletion mode or an acceptor dopant for changing a depletion mode to an enhancement mode, said transistors being n-channel devices.

20. A system according to claim 19 wherein said pocket layer extends from a location beneath said source region to a location beneath said drain region.

21. A system according to claim 20 further comprising
a substrate of p+GaAs disposed beneath said second layer; and
an electrode disposed on the back side of said substrate away from said second layer for receiving a voltage which is negative relative to said source terminal; and wherein
said first layer comprises n+AlGaAs and said second layer comprises intrinsic GaAs, each of said transistors being formed as an enhancement mode device in the absence of said pocket layer, said pocket layer being doped with silicon to provide a pocket of n+GaAs.

22. A system according to claim 1 wherein said mode changing means comprises a dopant specific to the mode of operation of a transistor above said mode changing means, there being either an acceptor dopant for changing an enhancement mode to a depletion mode or a donor dopant for changing a depletion mode to an ehancement mode, said transistors being p-channel devices.

23. A system according to claim 1 wherein said mode coupling means comprises a dopant specific to the mode of operation of a transistor above said mode changing means, there being either a donor dopant for changing an enhancement mode to a depletion mode or an acceptor dopant for changing a depletion mode to an enhancement mode, said transistors being n-channel devices.

24. A system according to claim 23 wherein said mode changing means comprising a pocket layer of semiconductor material spaced apart from said source region and said drain region; said system further comprising
a substrate of p+GaAs disposed beneath said second layer; and
an electrode disposed on the back side of said substrate away from said second layer for receiving a voltage which is negative relative to said source region; and wherein
said first layer comprises n+AlGaAs and said second layer comprises intrinsic GaAs, each of said transistors being formed as an enhancement mode device in the absence of said pocket layer, said pocket layer being doped with silicon to provide a pocket of n+GaAs.

25. A field-effect transistor structure comprising:
a source region, a drain region and a gate electrode located between said source region and said drain region;
a first layer of semiconductor material, said gate electrode being deposited upon first layer to form therewith a gate terminal;
a second layer of semiconductor material interconnecting said source region and said drain region to form a charge conduction channel therebetween upon the application of a voltage between said source region and said drain, region said first layer being deposited upon said said second layer; and
a third layer disposed as a pocket within said second layer and being located beneath said gate terminal and spaced-apart therefrom, said pocket layer being doped to offset energy band levels within said first layer for changing the characteristics of said transistors structure between the two characteristics of enhancement mode of operation and depletion mode of operation.

26. A transistor structure according to claim 25 wherein said pocket layer extends laterally beneath said source region and said drain region.

27. A transistor structure according to claim 25 wherein said pocket layer comprises a dopant specific to the mode of operation, there being either an acceptor dopant for changing an enhancement mode to a depletion mode or a donor dopant for changing a depletion mode to an enhancement mode, said transistor structure being a p-channel device.

28. A transistor structure according to claim 27 wherein said first layer and said second layer comprise semiconductor components of elements of Group III and Group V of the periodic table.

29. A transistor structure according to claim 25 wherein said pocket layer comprises a dopant specific to the mode of operation, there being either a donor dopant for changing an enhancement mode to a depletion mode or an acceptor dopant for changing a depletion mode to an enhancement mode, said transistor structure being an n-channel device.

30. A transistor structure according to claim 29 wherein said first layer and said second layer comprise semiconductor components of elements of Group III and Group V of the periodic table.

31. A transistor structure according to claim 30 wherein said first layer comprises n+AlGaAs and said second layer comprises intrinsic GaAs, said transistor structure being formed as an enhancement mode device in the absence of said pocket layer, said pocket layer being doped with silicon to provide a pocket of n+GaAs.

32. A transistor structure according to claim 31 further comprising a substrate of p+GaAs disposed beneath said second layer.

33. A transistor structure according to claim 32 further comprising an electrode disposed on the back side of said substrate away from said second layer for receiving a voltage which is negative relative to said source terminal.

34. A transistor structure according to claim 33 wherein said gate electrode is formed of metal contiguous to said first layer to provide a Schottky barrier at said gate terminal.

35. A transistor structure according to claim 25 wherein said pocket layer is located beneath the charge conduction channel at a depth which is greater than approximately three wavelengths of the electron wave function, but less than the spacing between said source and said drain regions to alter a threshold voltage while preserving high carrier mobility in said transistor structure.

36. A transistor structure according to claim 35 wherein said pocket layer comprises a dopant specific to the mode of operation, there being either an acceptor dopant for changing an enhancement mode to a depletion mode or a donor dopant for changing a depletion mode to an enhancement mode, said transistor structure being a p-channel device.

37. A transistor structure according to claim 35 wherein said pocket layer comprises a dopant specific to the mode of operation, there being either a donor dopant for changing an enhancement mode to a depletion mode or an acceptor dopant for changing a depletion mode to an enhancement mode, said transistor structure being n-channel device.

38. A transistor structure according to claim 37 further comprising:
- a substrate of p+GaAs disposed beneath said second layer; and
- an electrode disposed on the back side of said substrate away from said second layer for receiving a voltage which is negative relative to said source terminal; and wherein said first layer comprises n+AlGaAs and said second layer comprises intrinsic GaAs, said transistor structure being formed as an enhancement mode device in the absence of said pocket layer, said pocket layer being doped with silicon to provide a pocket of n+GaAs.

* * * * *